United States Patent
Lamarche et al.

(10) Patent No.: US 8,860,424 B1
(45) Date of Patent: Oct. 14, 2014

(54) APPARATUS AND METHOD FOR HIGHLY ACCELERATED LIFE TESTING OF SOLAR CELLS

(75) Inventors: Paul F. Lamarche, Morgan Hill, CA (US); Brett Julian Chicotka, San Jose, CA (US)

(73) Assignee: Solar Junction Corporation, San Jose, CA (US)

( * ) Notice: Subject to any disclaimer, the term of this patent is extended or adjusted under 35 U.S.C. 154(b) by 143 days.

(21) Appl. No.: 13/407,446

(22) Filed: Feb. 28, 2012

Related U.S. Application Data (60) Provisional application No. 61/451,537, filed on Mar. 10, 2011.

(51) Int. Cl.
*G01R 31/26* (2014.01)

(52) U.S. Cl.
USPC .................. 324/501; 324/761.01; 324/762.01; 324/96; 165/61

(58) Field of Classification Search
USPC ............ 324/501, 761.01, 762.01, 96; 165/61, 165/201
See application file for complete search history.

(56) References Cited

U.S. PATENT DOCUMENTS

| | | | |
|---|---|---|---|
| 6,154,034 A | 11/2000 | Lovelady et al. | |
| 6,171,641 B1 * | 1/2001 | Okamoto et al. | 427/8 |
| 6,639,421 B1 * | 10/2003 | Yoshino et al. | 324/761.01 |
| 7,514,931 B1 * | 4/2009 | Shimotomai et al. | 324/403 |
| 2002/0171441 A1 | 11/2002 | Jayamaha | |
| 2005/0183854 A1 * | 8/2005 | Gat | 165/201 |
| 2008/0196834 A1 * | 8/2008 | Mizuno et al. | 156/345.21 |
| 2009/0072837 A1 * | 3/2009 | Kushiya et al. | 324/501 |
| 2010/0046575 A1 * | 2/2010 | Hebert et al. | 374/57 |
| 2010/0307687 A1 * | 12/2010 | Mitsuhashi et al. | 156/345.34 |
| 2012/0073781 A1 * | 3/2012 | Yamawaku et al. | 165/11.1 |

OTHER PUBLICATIONS

Cincinnati Sub-Zero, Thermal Shock Testing Services, Oct. 12, 2009, p. 1.*
Newport, 1600W Xenon Research Arc Lamp Sources, Jul. 6, 2010, p. 1 and 2.*

* cited by examiner

*Primary Examiner* — Huy Q Phan
*Assistant Examiner* — David Frederiksen
(74) *Attorney, Agent, or Firm* — Kenneth Allen; William R. Lambert; Kilpatrick Townsend & Stockton LLP (57) ABSTRACT

An apparatus is provided for highly accelerated life testing (HALT) of multi-junction solar cells according to a method that utilizes a high vacuum chamber, as well as lenses and windows transparent to broad spectrum solar radiation from typically a single source to house packaged solar chips and temperature monitoring and control means during testing, thereby allowing substantially greater control of environmental variables such as temperature, atmospheric composition, and light spectrum than is currently available.

17 Claims, 8 Drawing Sheets

APPARATUS AND METHOD FOR HIGHLY ACCELERATED LIFE TESTING OF SOLAR CELLS

CROSS-REFERENCES TO RELATED APPLICATIONS

The present application claims benefit under 35 USC 119(e) of U.S. provisional Application No. 61/451,537 filed Mar. 10, 2011.

STATEMENT AS TO RIGHTS TO INVENTIONS MADE UNDER FEDERALLY SPONSORED RESEARCH OR DEVELOPMENT

This invention was made with Government support under NAT-0-99013-03 awarded by the United States Department of Energy. The Government has certain rights in this invention.

BACKGROUND OF THE INVENTION

This invention relates to a method and apparatus for highly accelerated life testing of photovoltaic solar cells.

Highly concentrated photovoltaics (HCPV) is an emerging solar technology with tremendous market potential because of its very high energy production density, its ability to scale to any size deployment, and its ability to operate more efficiently than other photovoltaic (PV) technologies in areas with high insolation and rapidly varying ambient and localized temperatures.

The success of HCPV in utility and commercial markets is closely linked to the ability of these systems to achieve grid parity with fossil fuel energy production. Elements in achieving a levelized cost of energy consistent with grid parity are decreased module cost, high reliability, and low operational and maintenance cost. Improved cell efficiency and reliability have a large impact in lowering all of these cost elements. Higher efficiency and reliability result in a lower module cost per watt since fewer modules are required to produce the initial target power and the power degradation is low. Maintenance costs are also reduced because there are fewer modules to maintain and the lower frequency at which they must be serviced due to cell degradation. Any advantages from higher cell efficiency, however, can be negated if the cell power output decreases rapidly over time. Likewise, a very small decrease in cell performance over time has little impact if the initial cell efficiency is low. Thus, it is important for the cell to have both high efficiency and high reliability.

One way to ensure high efficiency and high reliability is to use "Highly Accelerated Life Tests" (HALT) during solar cell development. HALT testing is designed to test semiconductor cells beyond expected field conditions to identify the operating and failure limits of the cell. Although HALT may also be used to determine solar cell lifetimes, the main goal of HALT is to identify, analyze, and correct inherent design weaknesses that may exist in the epitaxial, in the wafer fabrication processes and in the manufacturing/assembly process. The approach is to test devices to failure using HALT methodology with various stresses, to perform root cause analysis of the failure, and then to take corrective action to improve the process and/or product. The operating range and failure limits identified during HALT can also be used to develop a "Highly Accelerated Stress Screen" (HASS) for later phases of manufacturing or packaging processes, which will allow rapid identification of downstream process flaws.

Performing HALT on solar cells under real-life field conditions has proven difficult because of the rapid thermal transitions experienced by solar cells during their expected 30+ year lifespan. The known prior relevant art does not disclose how to adequately maintain the strict environmental controls necessary for rapid thermal transition stresses during longer term HALT on solar cells.

U.S. Patent Publication 2010/0046575 A1 discloses a method and system for performing thermal stress testing of photovoltaic solar cells. The system and method present a means of rapidly applying thermal stresses to one solar cell at a time under uncontrolled ambient conditions. The publication does not disclose an apparatus or method for HALT, nor does it disclose how to repeatedly and reliably use rate of temperature change as a stressor. It also does not disclose any method or apparatus to control the environmental conditions, which is particularly important when going to high and low temperatures.

U.S. Pat. No. 6,154,034 discloses a method and apparatus for testing multi junction photovoltaic solar cells using multiple flashlamps, with a separate flashlamp provided for each junction of the solar cell so that the spectrum of each flashlamp can be tailored to the spectrum in which the corresponding junction is designed to operate. This patent does not disclose any apparatus or method for suitable for HALT. It merely describes a flash tester for characterization and does not disclose or teach any methods for accelerated life testing.

US Patent Publication 2002/0171441 A1 discloses a method and apparatus for accelerated life testing (ALT) of solar cells in which high-intensity laser light (generated by a diode) is focused onto a small area of a solar cell for a predetermined period of time to simulate long-term sun exposure. Performance of the solar cell is measured to determine life expectancy. The application uses diode laser light to overcome the heat build-up and focusing difficulties created by Xenon discharge light. The application does not disclose an apparatus or method for HALT. It also does not disclose any method or apparatus to control the environmental conditions, which is particularly important when going to high and low temperatures.

What is needed is an apparatus and method for performing HALT that accelerates the rapid thermal transition stresses as well as atmospheric stresses in a controlled environment on a solar cell in a short timeframe beyond the level of environmental stresses that a cell might encounter in its 30+ years lifetime.

BRIEF SUMMARY OF THE INVENTION

According to the invention, an apparatus is provided for highly accelerated life testing (HALT) of multi junction solar cells that utilizes a vacuum chamber, as well as lenses and windows transparent to broad spectrum solar radiation to house packaged solar chips and temperature monitoring and control means during testing, thereby allowing substantially greater control of environmental variables such as temperature, atmospheric composition, and light spectrum than is currently available. This environmental control permits multiple solar cells to be tested as if in different geographical locations (e.g., different altitudes, rural areas, or polluted urban areas). The apparatus further allows testing of solar cells to be restricted to the high stress conditions during which the cells are most likely to fail—that is, during accelerating ramp-up to steady state irradiated temperature (i.e., during ramp-up to maximal direct insolation) and during decelerating ramp-down to steady state non-irradiated temperature (i.e., during ramp-down to non-illuminated state).

In a particular embodiment a streamlined apparatus activates a light external to the vacuum chamber that has a broad spectrum without the need for multiple narrow bandwidth light sources. The light is directed through for example six Fresnel lenses which are focused on six secondary lenses then through a transparent window in the top of the vacuum chamber such that the light is focused onto the solar cell. The broad spectrum light source allows irradiation of multi junction solar cells with a single light source across a 240 nm to 2500+ nm spectrum—which includes wavelengths not currently absorbed in commercial multi junction cells yet likely to be absorbed in future multi junction cells as the number of discrete junctions increase. A shuttering system allows pulsing irradiation of the device under test (DUT) at variable frequencies without the delays necessary with pulsing Xenon lamps (i.e., delays between off and on states for the lamp to cool).

A thermal stage in the chamber that seats the packaged solar chip allows the temperature of the solar chip to be manipulated rapidly with heat and/or liquid nitrogen influx within a $-140°$ C. to $+275°$ C. range. Because maintaining the temperature of a solar chip at $-140°$ C. in a high-humidity environment is difficult, placing the thermal stage in an evacuated chamber provides an easy, efficient, and cost-effective way to eliminate humidity in the testing environment so as to be able to maintain very low temperatures for extended periods of time.

The invention allows accelerated lifespan testing of solar cells in true-to-life environmental conditions, yet reduces to approximately one week the time necessary to test solar cells designed to perform for many years in a natural environment. The HALT apparatus allows a cell to be stressed with high intensity light for an extended period of time until the chip fails, thereby facilitating identification of design flaws that can be then be modified early in the chip development process (e.g., during epitaxial and wafer fabrication stages). Thus, HALT reduces the ultimate cost of solar technology development.

The invention further provides a method for highly accelerated life testing of solar cells. The method comprises mounting a packaged solar cell upon a thermal stage disposed within a vacuum-controlled chamber, manipulating the temperature of the thermal stage to control the temperature of the solar cell disposed thereon by conductive heating and cooling, focusing radiation from a light source from outside of the chamber through a plurality of typically six Fresnel lenses which are focused on a corresponding number of secondary lenses then through a transparent window in the top of the vacuum chamber such that the light is focused onto the solar cell, then shuttering or modulating radiation from the light source to control the parameters of the irradiation of the solar cell, and measuring functional characteristics of the solar cell.

The HALT apparatus and method as described permit failure analysis of solar cells, as well as lifespan testing under real-life conditions. Spectral characteristics differ in differing regions. For example spectral characteristics of insolation in Los Angeles, Calif. differ from the spectral characteristics of insolation in Denver, Co. The present invention allows solar cells to be tested under environmental conditions representative of a specific desired geographic locale, i.e., e.g., under high altitude, highly corrosive, or acidic conditions. Other benefits from the invention will become readily apparent to those of skill in the arts of semiconductor design and packaging from the following detailed description in connection with the accompanying drawings.

DETAILED DESCRIPTION OF THE INVENTION

Figure 1:
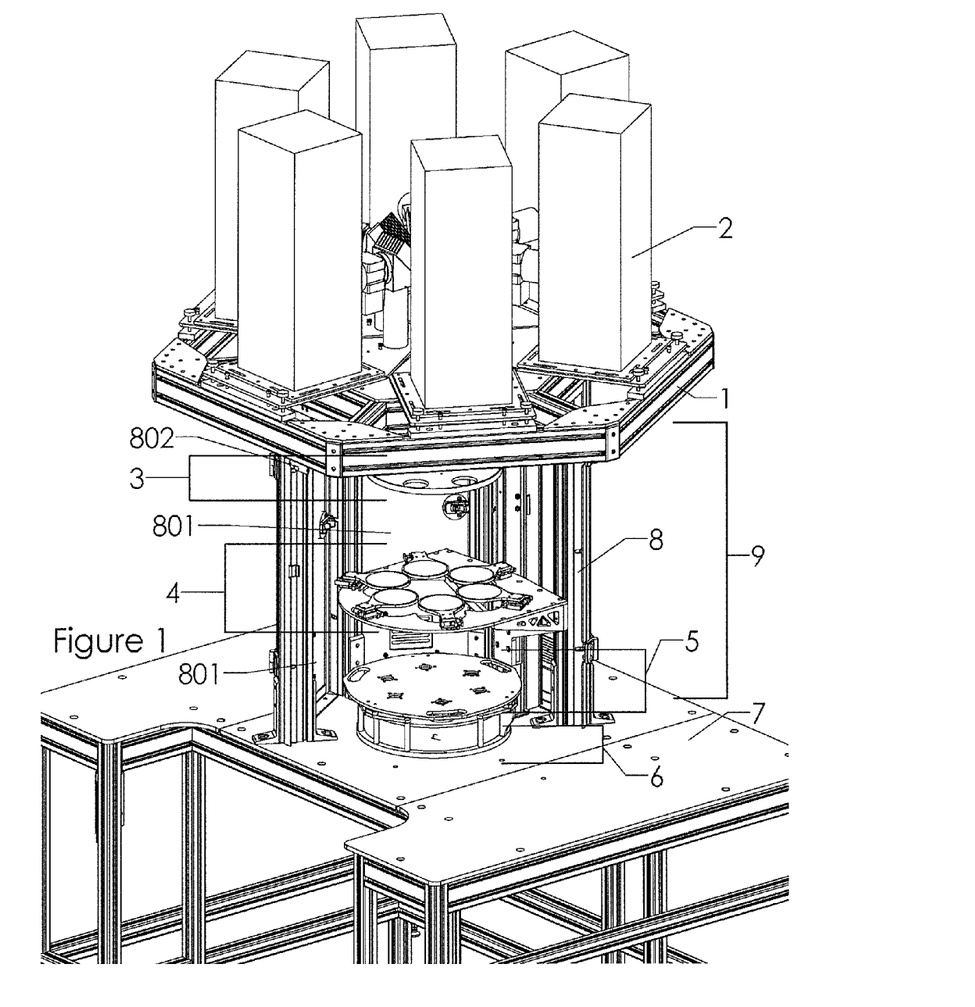
FIG. 1 is an elevation view of one embodiment of the HALT testing apparatus of the invention.

FIG. 1 shows one embodiment of a HALT apparatus of the invention. The components of the apparatus as shown are organized vertically to conserve space, although one skilled in the art will understand that other arrangements are possible if desired. The upper frame 1 of the apparatus serves as a platform for one or more light boxes 2, each of which contains an independent light source (not shown). The frame posts 8 supporting upper frame 1 form the shell of lower frame region 9. Lower frame region 9 houses components to focus and concentrate light on the solar cell, including a light shuttering system 3, a light focusing system 4, a light clipping/secondary system 5, and a vacuum test chamber 6. Support structure 7 forms the base on which vacuum test chamber 6 sits and provides sealed input and output connections thereto.

Figure 2:
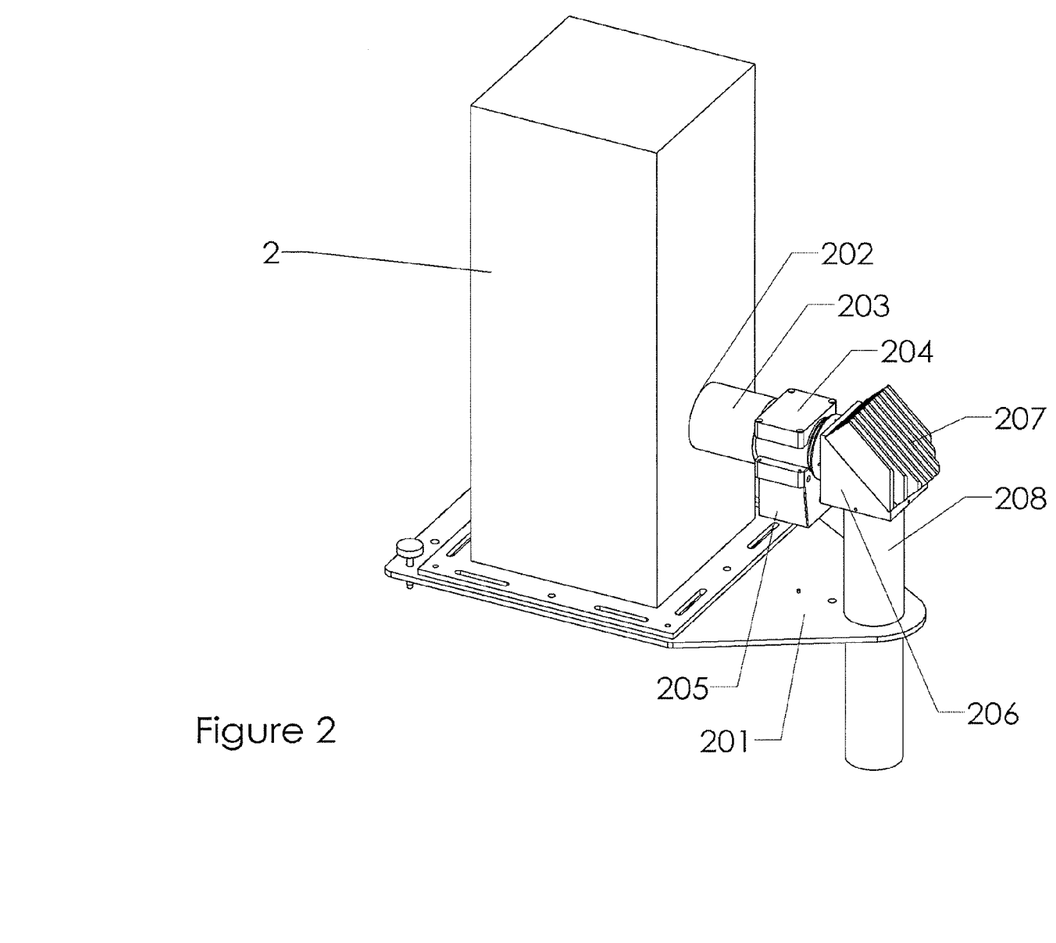
FIG. 2 is a side elevation view of a light box used in one embodiment of the invention.
Figure 4:
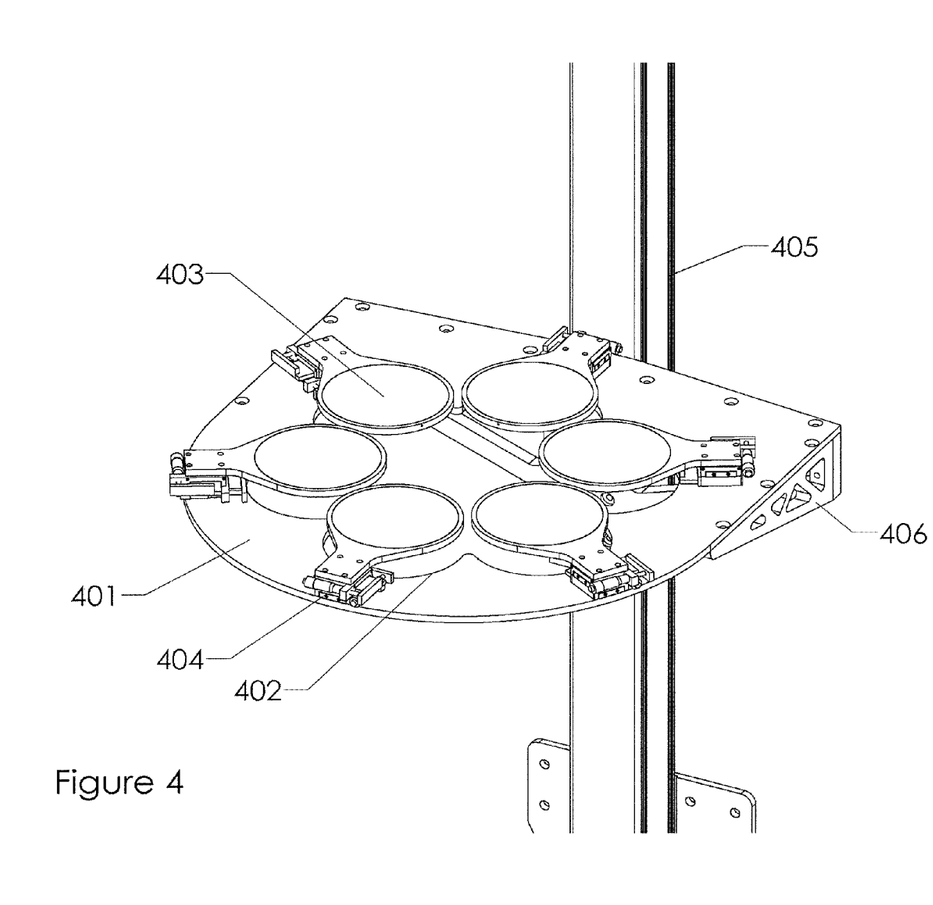
FIG. 4 is an exploded side elevation view of one embodiment of the Primary light focusing system of the HALT testing apparatus.
Figure 5:
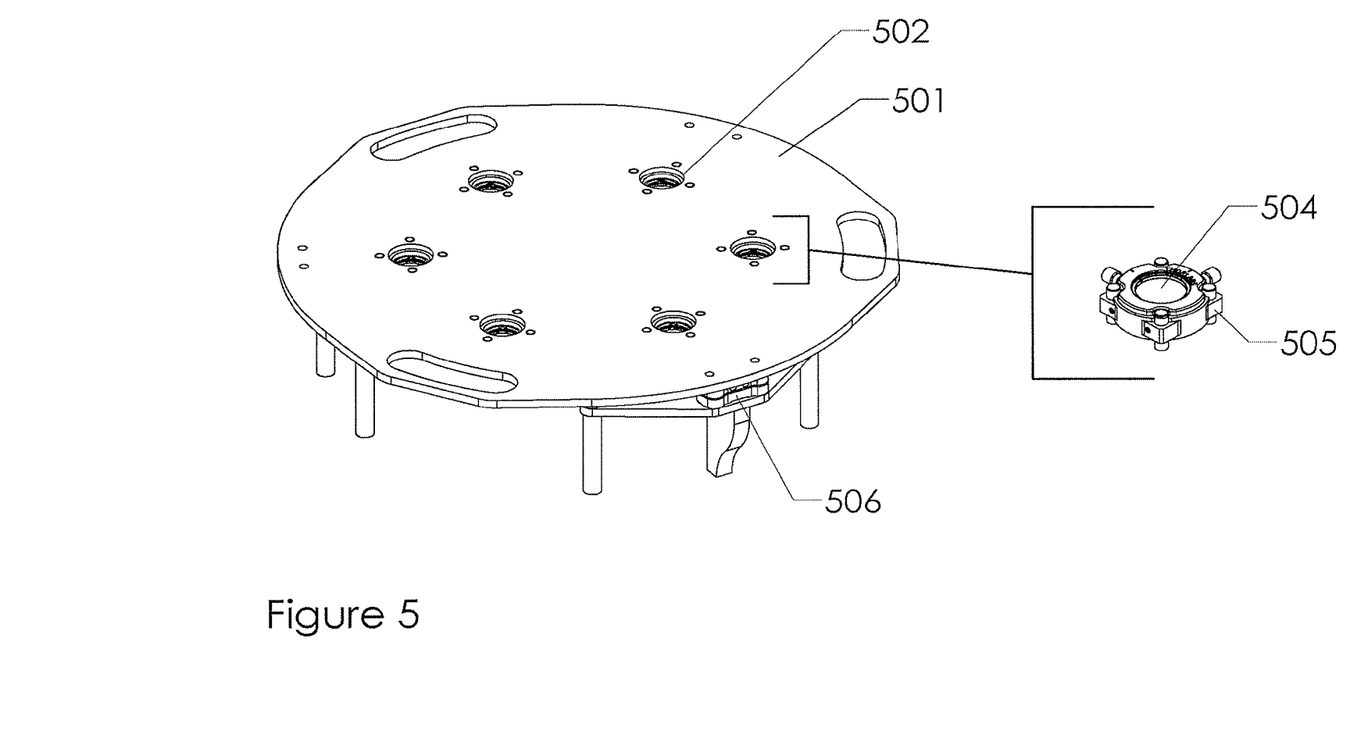
FIG. 5 is an exploded side elevation view of one embodiment of the secondary light amplification lenses/clipping aperture system of the HALT testing apparatus.

Referring to FIGS. 1 and 2, the base plate 201 of each light box 2 is securely attached to upper frame 1 with three or more points of attachment such that each light box can be moved in three planes to focus the light emitted from each box 2 onto the light focusing system 4 and light clipping/secondary system 5 (shown in FIGS. 4 and 5, respectively). The light box preferably houses a Xenon ozone-free 1600 W lamp emitting a spectrum covering the range of about 240 nm to 2500 nm, although one of skill in the art will recognize that other lamps may be substituted depending on testing needs.

Referring to FIG. 2, the output from each light source (not shown) passes through a condenser lens aperture 202 on the side of the light box 2 into collimator 203. To maintain temporal stability of the light source, a small fraction of light exiting collimator 203 is redirected by prism optics assembly 204 downwards through a photodiode 205 connected to a light intensity controller (not shown). The light intensity controller communicates with the lamp power supply to increase or decrease the power to the light source to compensate for fluctuations in light output. The larger fraction of light passes from collimator 203 directly to mirror 206 which has a heat-sink 207 attached thereto. Mirror 206 bends the output light into collimator 208 to direct the light through base plate 201 to a light shuttering system 3.

One of skill in the art will recognize that the solar simulator used in the invention produces a high intensity light across a broad spectrum (including the ultraviolet range), and that the HALT apparatus requires embedded safety devices to protect users from the emitted light. Referring to FIG. 1, safety measures, without limitation, may include one or more of the following: (1) enclosing lower frame region 9 within tinted polycarbonate walls 801; (2) wiring safety interlocks to the lighting system, e.g., latching each wall panel 801 with a coated magnetic safety switch device 802 to shut off the light source when any panel 801 is open; (3) wiring safety interlocks to an ambient nitrogen sensor and to a nitrogen ventilation status check so that nitrogen is shut off if ventilation is lost; (4) wiring an external emergency stop switch to the apparatus; and (5) wiring a manual override switch to enable operation of the chamber with one or more wall panels 801 open.

Figure 3:
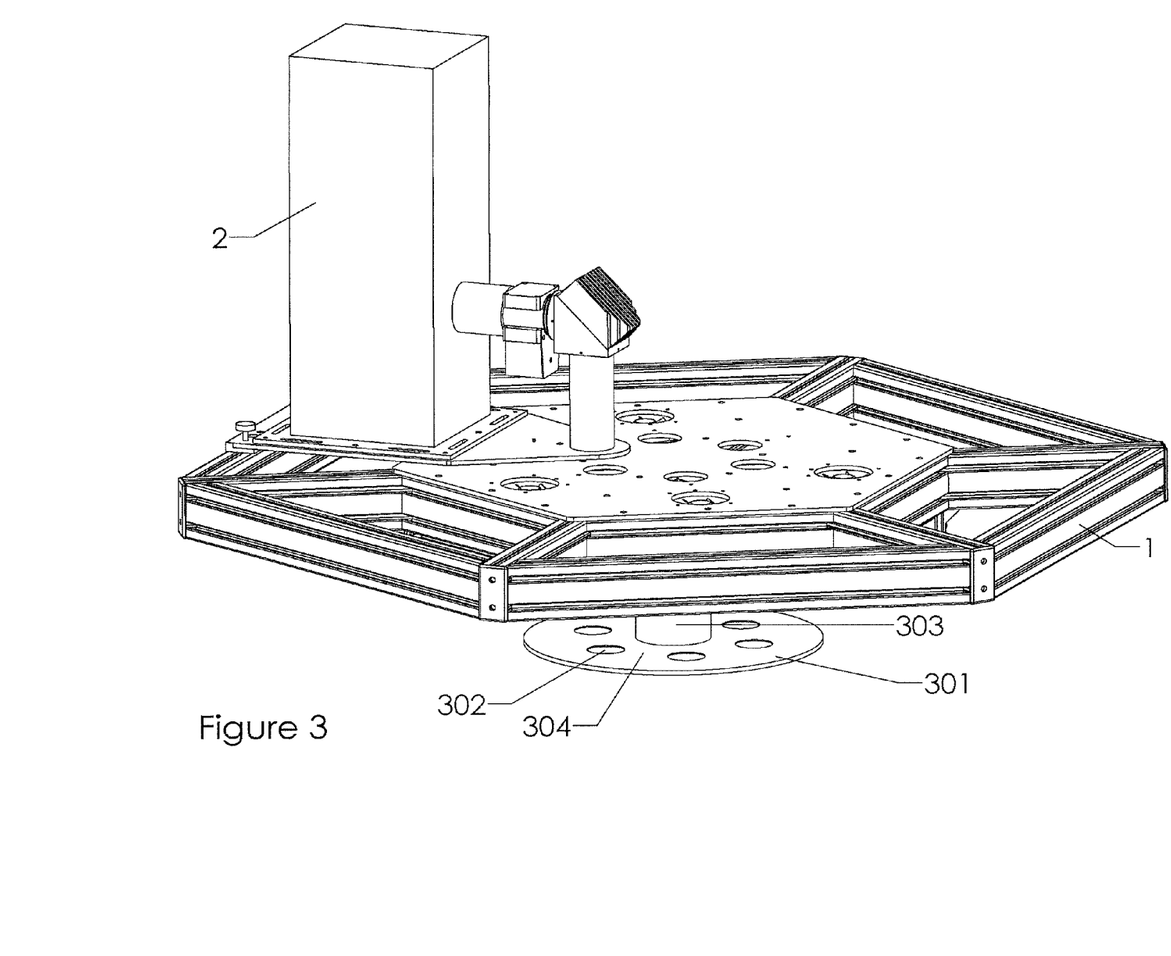
FIG. 3 is a side elevation view of the light shuttering system of one embodiment of the invention.

Referring to FIGS. 1 and 3, light shuttering system 3 is attached within lower frame region 9 to the underside of upper frame 1. Light shuttering system 3 comprises a shuttering wheel 301 with one or more aperture 302 therethrough, and rotation control means 303, such as, without limitation, an actuator mounted to the underside of lower frame region 9 and to the upper surface of shuttering wheel 301, as well as any associated mechanical or electronic controllers. Light exiting from light shuttering system 3 is directed downwards to light focusing system 4.

Rotation control means 303 control the direction and rate of rotation movement of shuttering wheel 301 to allow light to pass or to prevent light from passing through aperture 302. One skilled in the art will recognize that light emitted from the source can be shuttered in a number of ways to control the timing of on/off cycles, repetition rate, and the duration of simulated insolation and thereby mimic conditions of summer sun days or cloudy winter days. For example, wheel 301 can be programmed to rotate 360° with the light shuttered off as non-apertured sections 304 of wheel 301 pass below the light beam. As another non-limiting example, wheel 301 can be programmed to rotate a set distance in one direction (e.g., 30° clockwise) and then rotate back in the opposite direction (e.g., 30° counterclockwise) such that aperture 302 passes below the light beam in one position and non-apertured sections 304 of wheel 301 pass below the light beam in the second position.

Referring to FIGS. 1 and 4, light focusing system 4 comprises a moveable lens tray 401, a focusing actuator 405, one or more lenses 403, and one or more x-y translation stages 404. One of skill in the art will recognize that the one or more lenses 403 can be, e.g., without limitation, a fused silica precision plano-convex, a Fresnel lens, or a parabolic reflector. Each of the one or more translation stages 404 is attached to the top of the one or more apertures 402 traversing tray 401. Each lens 403 is mounted within an independent x-y translation stage 404 such that each lens 403 can be adjusted independently to move the focal point of light passing through lens 403 in either or both of the x and y planes. Tray 401 is moveably attached to focusing actuator 405 (by example, without limitation, as by means of attachment 406) such that the position of the tray can be moved vertically to change the intensity of the light passing through lens 403. The radiation from the solar simulator can be concentrated from one sun to thousands of suns.

Referring to FIGS. 1 and 5, a light clipping/secondary lens system 5 is attached to the base of lower region 9 below light focusing system 4, and acts to further increase and collimate light impinging on vacuum chamber 6. Light clipping system 5 comprises clipping plate 501 with one or more channels 502, and one or more clipping aperture/secondary 504 each mounted on a translation stage 505 allowing radial and torsional positional adjustments. Each clipping aperture/secondary 504 and its associated translation stage 505 are attached to the underside of one of the one or more channels 502. Clipping plate 501 is preferably graphite to accommodate high temperatures, although the clipping plate 501 may be constructed from non-graphite material with low reflectivity that can be used at very high temperatures if desired. Clipping aperture/secondary 504 is designed to size/amplify the emitted light beam to ensure that the beam irradiates only the desired surface area of the DUT. For example, with a 5.5×5.5 mm solar cell as the DUT, each clipping aperture is fixed to allow only a 5 mm beam to pass through to the DUT. One of skill in the art will recognize, however, that clipping aperture 504 can be adjusted to control the size of the beam targeted at DUTs of different sizes.

Clipping system 5 is attached to the base of lower region 9 preferably with one or more kinematic mounts 506 to allow highly repeatable placement of plate 501 on mounts 506. Mounts 506 are arrayed such that clipping plate 501 is suspended over chamber 6 so that light output from each clipping aperture/secondary 504 can be precisely aligned to each window 609 (shown in FIG. 6B) in the lid of chamber 6.

Referring to FIGS. 1, 6A, 6B and 7, vacuum chamber 6 is a high-quality vacuum chamber capable of maintaining an internal chamber pressure of about $10^{-6}$ to $10^{-7}$ Torr. Vacuum pressure is maintained with vacuum pump 701. Vacuum pump 701 removes virtually all the moisture from the test environment which allows the HALT chamber environment to be maintained at low temperatures (e.g., −100° C.) for extended periods of testing. Vacuum pump 701 also allows the atmospheric contents of the chamber to be removed, after which the chamber can be backfilled with differing test environments, e.g., (without limitation), an atmosphere rich in oxygen, or a polluted atmosphere such as that in urban areas or an inert gas. High-humidity environments can also be mimicked with the vacuum chamber of the invention, although the humidity will prevent long-term maintenance of very low temperatures for testing.

Figure 6A:
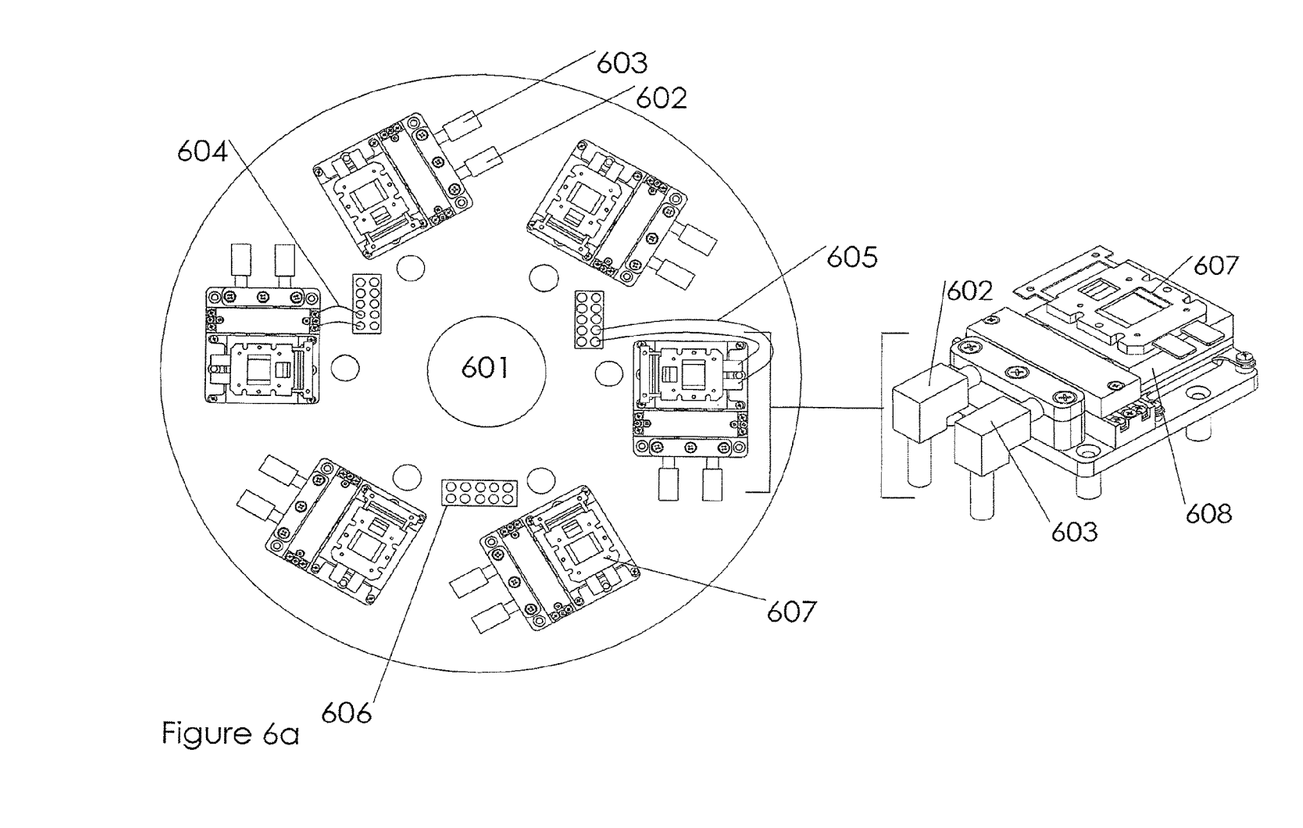
FIG. 6A is a plan view schematic of HALT chamber of one embodiment of the invention with lid removed
Figure 7:
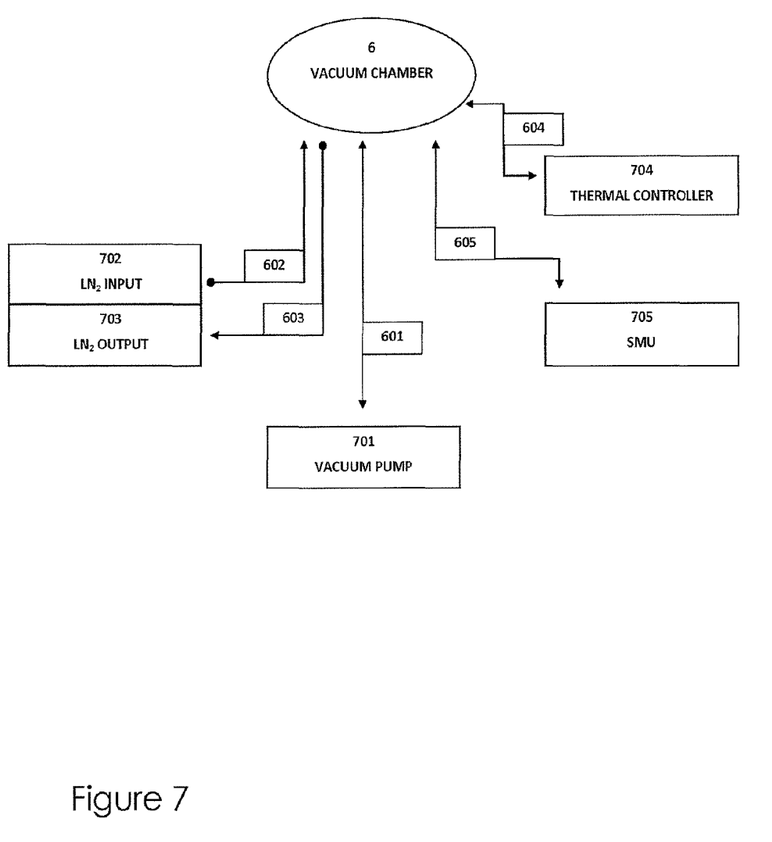
FIG. 7 is a black box schematic of inputs to and outputs from the HALT chamber of the embodiment of FIG. 1.

Referring to FIGS. 6A and 7, vacuum chamber 6 houses one or more thermal stages 608, each of which may have a DUT 607 affixed thereto. Liquid nitrogen ($LN_2$) flows into (FIG. 7 602) and out of (603) each stage 608 to cool DUT 607 affixed thereto. Each stage 608 may be heated by an independent resistive heater (not shown), and the temperature of stage 608 may be measured by an independent resistive thermal device (not shown) which has electrical connections 604 to and from the thermal controller 704. Under vacuum, a uniform temperature can be attained rapidly and maintained independently for each thermal stage within the range of about −140° C. to +275° C. One or more terminal blocks 606 may be located within chamber 6 to receive and pass on electrical connections 605 to and from DUT 607, and thereby facilitate set-up and change out of the DUT before and after HALT testing.

Figure 6B:
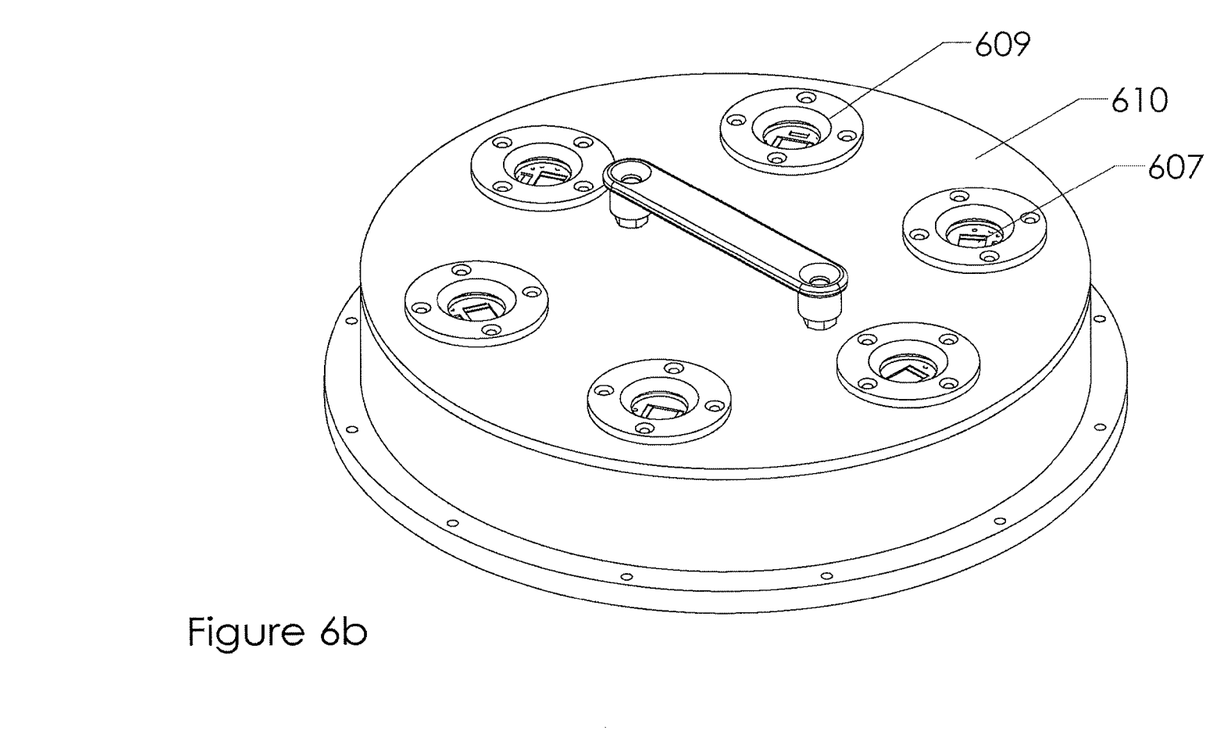
FIG. 6B is a side elevation view of HALT chamber of one embodiment of the invention with lid in place.

Referring to FIG. 6B, one or more highly polished quartz windows 609 may be embedded within the top surface 610 of chamber 6 to allow focused light from focusing system 5 to strike DUT 607.

Referring to FIGS. 1 and 7, vacuum chamber 6 is attached to a support structure 7. Sealed input and output connections pass through support structure 7 into chamber 6, including (1) vacuum hose 601, (2) tubing for liquid nitrogen to and from (602, 603 respectively) $LN_2$ valve system 702 and 703, (3) thermal stage electrical connections 604 to and from thermal controller 704, and (4) electrical connections 605 between source measurement unit (SMU) 705 and terminal block 606 located within chamber 6. SMU 705 is preferably a two-channel sourcemeter unit able to simultaneously source to a pair of terminals while measuring the current or voltage across those terminals (e.g., without limitation, Keithley Instruments Series 2602 A System Sourcemeter). Thus, voltage, amperage, and power generation parameters of photovoltaic solar cells can be collected before, throughout, and after HALT testing.

One or more remote communicating controllers (not shown) allow HALT testing to be performed without constant user monitoring. Preferably, a PLC computer is used for controlling safety systems and shutoffs, whereas PC-based control of light emission, shuttering, and data acquisition control is preferred. A laboratory computer control program such as LabVIEW (National Instruments Corp.) is used in a PC-based controller to control parameters of variables in testing, e.g., without limitation, light emission onset, offset, and duration, shuttering speed, temperature of thermal stage, and forward biasing if desired.

The HALT method of the invention comprises using the above discussed HALT apparatus to test a solar cell. More specifically, the method comprises mounting a DUT 607 in a test frame upon thermal stage 608 disposed within vacuum-controlled chamber 6, manipulating the atmosphere of the chamber 6, manipulating the temperature of thermal stage 608 to control the temperature of DUT 607 disposed thereon, focusing radiation from light source 2 outside chamber 6 through window 609 in top surface 610 of vacuum chamber 6 such that the light is focused onto DUT 607, shuttering radiation from light source 2 to control the parameters of the irradiation of DUT 607, and measuring functional characteristics of DUT 607. (shown in FIG. 1, 6A, 6B).

In the preferred embodiment, as shown in FIG. 1, 6A, 6B, six 5.5 mm solar cells on standard packages 607 are tested simultaneously in the HALT apparatus of the invention with six independent light sources 2, each of which is focused and channeled through only one window 609 of vacuum chamber 6 to simulate insolation of one solar cell 607 in a controlled environment. One of skill in the art will recognize, however, that the dimensions of the apparatus can be adjusted to accommodate the desired number and size of solar cells, and single solar cells may be tested alone or in serial succession. Furthermore, because the temperature of each thermal stage 608 can be modified independently, multiple DUTs 607 may be tested simultaneously under different temperature conditions.

Under normal forward-bias, atmosphere and temperature conditions cannot be well-controlled. Because the HALT method of the invention allows solar cell biasing to be induced internally (by light) or externally (electrically, e.g., by computer controller), forward biasing of the cell in the HALT chamber generates heat without light striking the solar cell, thereby mimicking cloudy real-life weather conditions. Thus, the method provides a way to correlate solar cell failure rates under the sun to less arduous and less expensive forward bias testing.

While the foregoing written description of the invention will enable one skilled in the art to make and use the invention, those skilled will understand and appreciate various suggested variations, combinations, and equivalents of the specific embodiment, method, and examples herein. The invention should therefore not be limited by the above describes embodiments, methods, and examples, but by all embodiments and methods within the scope and spirit of the invention.

What is claimed is:

1. An apparatus for highly accelerated life testing of solar cells, comprising:
   a chamber, a top surface of the chamber comprising a window transparent to radiation;
   a radiation source, wherein the radiation source is configured to project radiation through the window;
   a collimator configured to collimate the radiation;
   a light shuttering system comprising a rotatable shuttering wheel, wherein the shuttering wheel comprises one or more apertures;
   a light focusing system comprising a lens, a focusing actuator, and a translation stage;
   a light clipping system comprising a clipping plate, wherein the clipping plate comprises an aperture and a translation stage;
   a thermal stage disposed within the chamber for receiving a solar cell in conductive thermal contact, wherein the thermal stage comprises a heating element and a cooling element for controlling a temperature of the solar cell; and
   control and measurement circuitry configured to establish the temperature and radiation parameters and to measure functional characteristics of the solar cell.

2. The apparatus according to claim 1, wherein the radiation source is an arc lamp.

3. The apparatus according to claim 1, further comprising a controller configured to control a direction of rotation and a rate of rotation of the shuttering wheel.

4. The apparatus according to claim 1, wherein the temperature of each the thermal stage is controlled by controlled infusion of electrical current, light, and a coolant through the stage.

5. The apparatus according to claim 4 wherein the coolant is liquid nitrogen.

6. The apparatus according to claim 4 further comprising a first regulator for manipulating a concentration of oxygen within the chamber.

7. A method of highly accelerated life testing a solar cell, comprising:
   providing the apparatus of claim 1;
   mounting a solar cell on the thermal stage;
   controlling the amount of radiation reaching the solar cell using the collimator, the light shuttering system, the light focusing system, and the light clipping system;
   controlling the temperature of the solar cell using the thermal stage; and
   measuring functional characteristics of the solar cell.

8. The method according to claim 7 wherein the apparatus comprises a controller configured to control a direction of rotation and a rate of rotation of the shuttering wheel.

9. The method according to claim 7 wherein the temperature is controlled by infusing one of electrical current and coolant through said thermal stage.

10. The method according to claim 9 wherein the coolant is liquid nitrogen.

11. The method according to claim 9 wherein the temperature of the thermal stage is controlled within the range of about −140° C. and +275° C.

12. The method according to claim 7 wherein the radiation source produces wavelengths in the range of about 240 nanometers to 2500 nanometers.

13. The method according to claim 12 wherein the radiation is concentrated to between 100 and 1200 suns.

14. The method according to claim 7 wherein concentration of oxygen within the chamber is manipulated to mimic high-altitude conditions.

15. The method according to claim 7 wherein a corrosive environment is maintained within the chamber during testing.

16. The method according to claim 7 wherein an acidic environment is maintained within the chamber during testing.

17. The method according to claim 7 wherein the solar cell is tested to failure.

* * * * *